United States Patent
Mohandru et al.

(10) Patent No.: US 9,009,413 B2
(45) Date of Patent: Apr. 14, 2015

(54) METHOD AND APPARATUS TO IMPLEMENT LAZY FLUSH IN A VIRTUALLY TAGGED CACHE MEMORY

(71) Applicant: Intel Corporation, Santa Clara, CA (US)

(72) Inventors: Varun K. Mohandru, Braunschweig (DE); Fernando Latorre, Barcelona (ES); Niranjan L. Cooray, Folsom, CA (US); Pedro Lopez, Molins de Rei (ES); Naveen Neelakantam, Mountain View, CA (US); Li-Gao Zei, Braunschweig (DE); Rami May, Haifa (IL); Jaroslaw Topp, Schoeppenstedt (DE); Thomas Gaertner, Braunschweig (DE)

(73) Assignee: Intel Corporation, Santa Clara, CA (US)

( * ) Notice: Subject to any disclaimer, the term of this patent is extended or adjusted under 35 U.S.C. 154(b) by 230 days.

(21) Appl. No.: 13/724,848

(22) Filed: Dec. 21, 2012

(65) Prior Publication Data

US 2014/0181388 A1    Jun. 26, 2014

(51) Int. Cl.
*G06F 12/08* (2006.01)
*G11C 7/10* (2006.01)
*G06F 12/10* (2006.01)

(52) U.S. Cl.
CPC .......... *G11C 7/1072* (2013.01); *G06F 12/0891* (2013.01); *G06F 12/0804* (2013.01); *G06F 12/1036* (2013.01)

(58) Field of Classification Search
CPC ............ G06F 12/0804; G06F 12/0891; G06F 12/1036; G06F 12/1063
See application file for complete search history.

(56) References Cited

U.S. PATENT DOCUMENTS

| | | | | |
|---|---|---|---|---|
| 4,814,981 | A | * | 3/1989 | Rubinfeld ...................... 711/144 |
| 5,253,203 | A | * | 10/1993 | Partovi et al. ............. 365/189.02 |
| 5,606,683 | A | * | 2/1997 | Riordan ........................ 711/207 |
| 6,079,003 | A | * | 6/2000 | Witt et al. ..................... 711/200 |
| 8,522,253 | B1 | * | 8/2013 | Rozas et al. .................. 718/108 |
| 2007/0250666 | A1 | * | 10/2007 | Sartorius et al. ............... 711/133 |
| 2010/0251260 | A1 | * | 9/2010 | May .............................. 718/108 |
| 2012/0137075 | A1 | * | 5/2012 | Vorbach ........................ 711/122 |

* cited by examiner

*Primary Examiner* — Hiep Nguyen
(74) *Attorney, Agent, or Firm* — Trop, Pruner & Hu, P.C.

(57) ABSTRACT

A processor includes a processor core including an execution unit to execute instructions, and a cache memory. The cache memory includes a controller to update each of a plurality of stale indicators in response to a lazy flush instruction. Each stale indicator is associated with respective data, and each updated stale indicator is to indicate that the respective data is stale. The cache memory also includes a plurality of cache lines. Each cache line is to store corresponding data and a foreground tag that includes a respective virtual address associated with the corresponding data, and that includes the associated stale indicator. Other embodiments are described as claimed.

22 Claims, 9 Drawing Sheets

METHOD AND APPARATUS TO IMPLEMENT LAZY FLUSH IN A VIRTUALLY TAGGED CACHE MEMORY

BACKGROUND

Processors often use virtual memory to store and retrieve data. Virtual memory enables data to have consecutive virtual memory addresses while being stored in various physical memory addresses that may not be continuous, and in more than one physical memory. The data may be accessed by translation of an associated virtual memory address to a corresponding physical memory address through use of a translation lookaside buffer (TLB). Virtual addresses also enable multiple processes to run in parallel where the program code from different processes use the same virtual addresses but the TLB maps the accesses to distinct physical address spaces.

In some computation scenarios, correspondence between virtual memory addresses and physical memory addresses may change, due to e.g., remap of the TLB, access restriction imposed on a portion of the data, change of context (e.g., use of the TLB by several different programs), etc. Typically, such changes in the contents of the TLB necessitate a flush of a cache memory and re-installation of data in the cache memory, which can be a time consuming and processor-intensive process, and can cause execution of instructions by the processor to be halted while the cache flush is conducted.

DETAILED DESCRIPTION

In various embodiments, a processor includes a cache memory, e.g., a virtually tagged cache memory that includes a plurality of cache lines, each cache line including a foreground tag to store a virtual address associated with data stored in the cache line, and a stale indicator that is to indicate whether the data stored in the cache line is stale. In response to a trigger condition, e.g., a portion of a TLB is remapped, implementation of an access restriction to some addresses in the TLB, or unavailability of an Address Space Identifier (ASID) for a new process where assignment of a first ASID to the new process implies context change for pre-existent data in the cache corresponding to the first ASID, a "lazy flush" instruction may be executed by an operating system, which causes the stale indicator of each cache line to be updated to indicate that the corresponding data stored in a data storage portion of the cache line is stale, and no immediate flush of the cache is done. The data in each cache line with an updated stale indicator may be treated as stale. Upon a request for first data, a controller of the cache can determine whether the first data with an associated physical address is stored in the cache, and if so, the controller may replace a virtual address stored in a first cache line that stores the first data with a first virtual address obtained from, e.g., a translation lookaside buffer and the controller may re-update the stale indicator to indicate that the first data is not stale. If the first data is not stored in the cache, the first data may be retrieved from another memory, e.g., a higher level cache memory or dynamic random access memory (DRAM), the retrieved data may be stored in a selected cache line, and data previously stored in the cache line may be overwritten, or if the data is in a modified state from initially stored data, the data may be flushed to the DRAM, as described below. In a lazy flush, only one cache line is flushed at a time, rather than flushing the entire cache memory at one time. In an out of order (OOO) implementation, software can execute a memory "fence" before executing the lazy flush so that the lazy flush doesn't overtake older memory operations.

Figure 1:
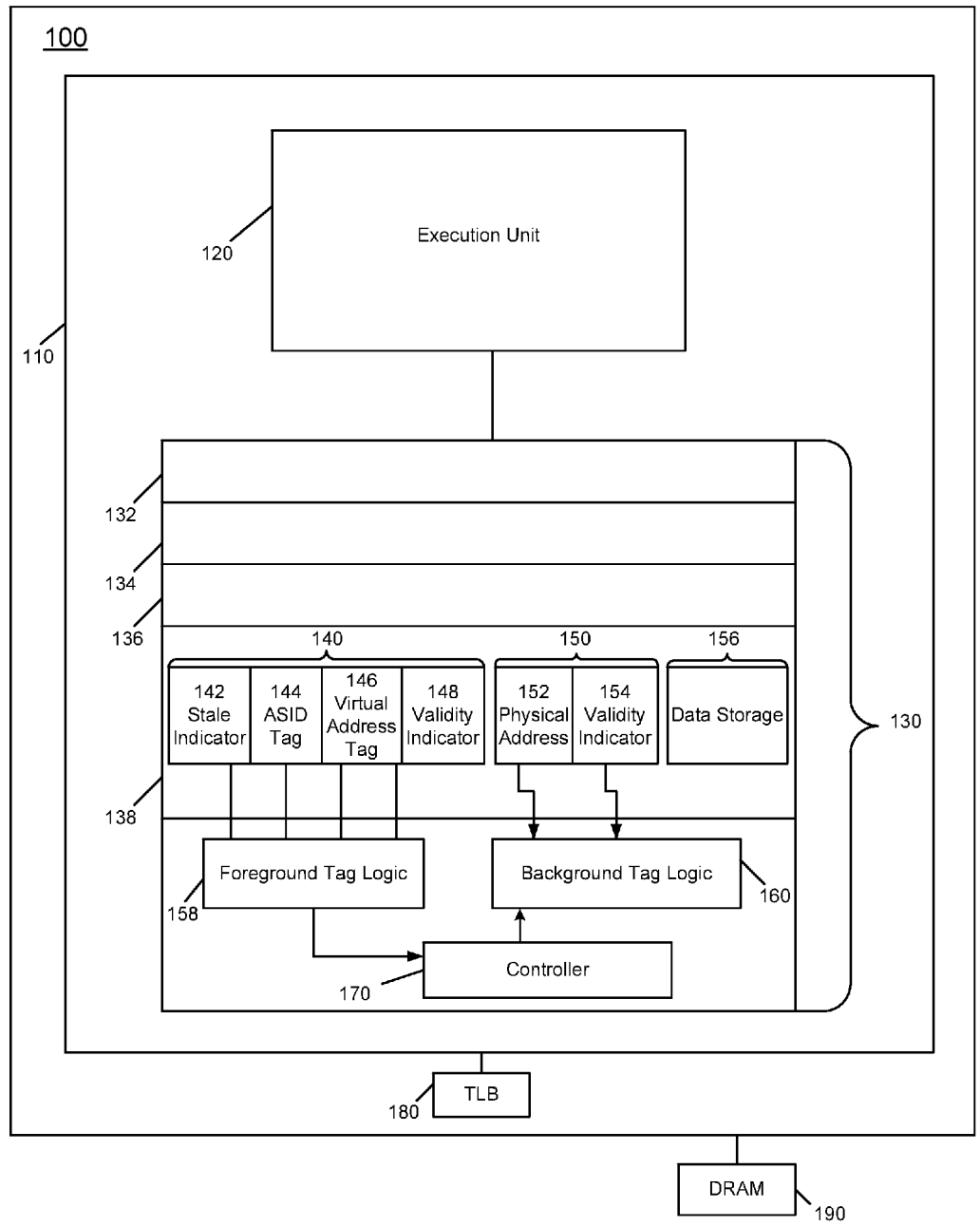
FIG. 1 is a block diagram of a processor according to an embodiment of the present invention.

Referring to FIG. 1, shown is a processor 100 that includes a virtually tagged cache memory, according to an embodiment of the invention. The processor 100 includes a processor core 110 and a translation lookaside buffer (TLB) 180 coupled to the processor core 110. The processor core 110 may include an execution unit 120 to execute instructions and a cache memory 130 to store data, e.g., program instructions or operands. The cache memory 130 may include a plurality of cache lines including, e.g., cache lines 132, 134, 136, and 138 (cache memory 130 may include more cache lines). Cache memory 130 may also include a controller 170, foreground tag logic 158, and background tag logic 160.

Each of the cache lines 132-138 may include a foreground tag (FT), a background tag (BT), and a data storage portion. For example, the cache line 138 includes FT 140, BT 150, and data storage portion 156. The FT 140 may store a plurality of indicators including a stale indicator 142, an ASID tag 144, a virtual address tag 146, and an FT validity indicator 148. The BT 150 may include a physical address tag 152 and a BT validity indicator 154.

In operation, a trigger event may occur that changes a correspondence between virtual memory addresses and physical memory addresses in the TLB 180 subsequent to storage of data in the cache memory 130, rendering the virtual address tags stale. For example, the trigger event may be a remapping of the TLB 180, an ASID tag reassignment due to, e.g., context change from a first program to a second program, or a TLB shootdown, (e.g., TLB flush that may result from implementation of restricted access to a portion of memory otherwise accessible via the TLB, which may be due to actions of another processor), or another trigger event. The trigger event may cause at least some of the virtual address tags in the cache lines to become stale, e.g., not in agreement with the current TLB entries.

In response to the trigger event, a lazy flush instruction (e.g., a lazy flush micro-operation) may be executed that causes a stale indicator to be updated in each of a plurality of cache lines of the cache 130. The stale indicator being updated can indicate that data stored in the corresponding cache line is stale, e.g., not current and therefore unusable. While some of the cache lines may store data that is not stale, updating each stale indicator may cause the processor core to determine whether or not the data stored in a cache line is stale on an as-needed basis, such as responsive to a data request from the processor core. Thus, instead of flushing the entire cache memory in response to a trigger event, only one cache line may be flushed in response to a data request following occurrence of a trigger event.

The processor core 120 may request first data from the cache memory 130. The request may include a virtual address of the first data, which may be sent to the cache memory 130. The controller 170 may look for a match of the virtual address of the first data and a virtual tag of an FT tag in the cache lines, such as the virtual tag 146 of the FT 140 in the cache line 138. Each of the indicators 142-148 may be input to the logic 158, which produces a miss unless the stale indicator is re-updated. Because the stale indicator of each FT in the cache memory 130 is updated, the output of logic 158 indicates a miss in the cache memory 130, which is returned to the controller 170. The controller 170 subsequently sends the first virtual address to the TLB 180 that provides a first physical address of the first data, which is compared with the physical address of each line entry of the cache memory 130, such as physical address 152. If a match is found, the physical address and a validity indicator are input to the BT logic 160 to determine whether the matching cache line stores valid data. If the matching line in the cache memory 130 stores valid data, the virtual address in the corresponding virtual address tag is replaced by the virtual memory address provided in the request for the first data received from the processor. Additionally, the stale indicator is re-updated and the stored data is returned to the execution unit 120 in response to the request.

If the physical address does not match any BT physical address in the BT tags within in the cache memory 130, the first data may be retrieved from another memory, e.g., the DRAM 190. The controller may select one of the cache lines to store the retrieved data, e.g., based on metadata included in each of one or more of the cache lines, and the controller may purge the stored data ("victim data") in the selected line. If the victim data has been modified ("dirty data") subsequent to its initial storage in the cache, the dirty data is flushed to the system memory, e.g., DRAM 190, before writing the retrieved data to the selected cache line to preserve the dirty data in the system memory. If the data in the selected cache line has not been modified subsequent to its initial storage in the cache (unmodified, or "clean" data), then the clean data in the selected cache line is overwritten with the retrieved data without a flush to the system memory, because the system memory already stores a current version of the clean data in the selected cache line.

Figure 2:
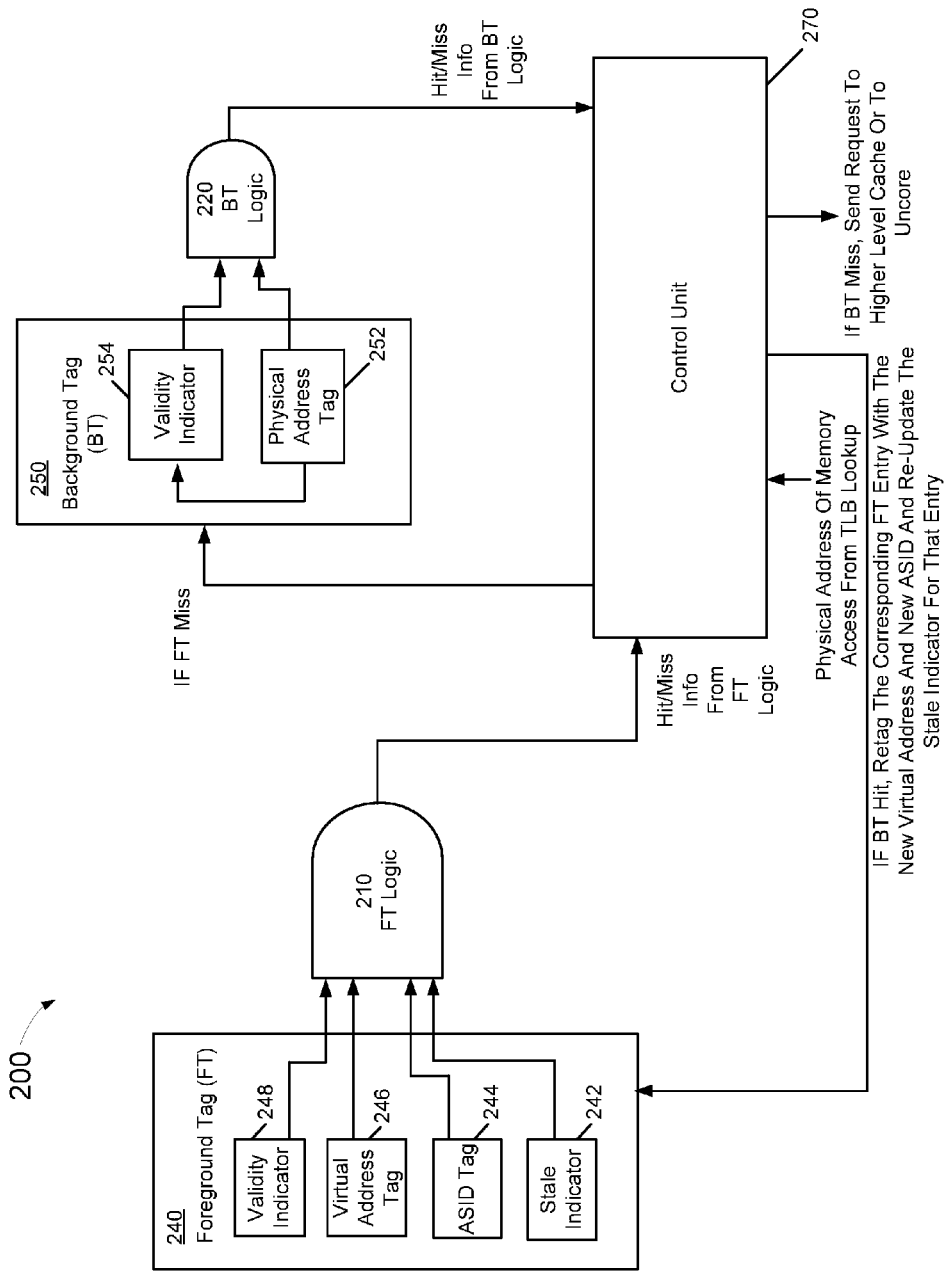
FIG. 2 is a block diagram of logic according to an embodiment of the present invention.

Referring now to FIG. 2, shown is logic 200 to evaluate parameters stored in a cache line of a cache memory, according to an embodiment of the invention. Foreground Tag (FT) logic 210 is to receive input including a stale indicator 242, an ASID tag 244 that is a match result from a comparison of the ASID stored in the FT 144 and the ASID of an incoming memory request, a virtual address tag match 246 that results from comparison of the virtual address tag stored in the FT 146 and a virtual address tag of the incoming memory request, and a validity indicator 248 for a given cache line, and the FT logic 210 may be configured to output an indication of a miss whenever the stale indicator is updated. In a lazy flush implementation the stale indicator is updated for each cache line. Consequently, the output 212 will indicate a miss in the cache memory, even if there is a match of the virtual address of the requested data and the stored virtual address in the virtual address tag, until the stale indicator is re-updated.

For example, an initial instance in which a cache line has the same virtual address as the requested data will miss in the cache memory due to the stale indicator being updated, which causes the controller to retrieve a corresponding physical address from a TLB of the processor and to compare the retrieved physical address to the stored physical address in the corresponding Background Tag (BT) of each cache line. A match with a stored physical address in the BT of a cache line indicates that the requested data is stored in the cache memory, and if a corresponding validity indicator indicates that the stored data is valid, BT logic 220 outputs an indication of a hit in the cache memory. The controller 230 locates the cache line storing the corresponding data, stores the virtual address of the requested data in place of the virtual address in the cache line, and re-updates the corresponding stale indicator.

A miss in the physical tag array 214 produces an indication of a miss in the output of the BT logic 220. The controller 230, upon receiving the indication of the miss, can retrieve the requested data from another memory, e.g., DRAM or higher level cache memory, based on the physical address supplied by the TLB. The controller may select a cache line to store the retrieved data and may determine whether to flush victim data currently in the cache line to the main memory. The victim data may be flushed (e.g., evicted) to the main memory if the victim data is dirty data (e.g., modified subsequent to its initial storage into the cache line) and the victim data may be overwritten if the victim data is clean (has not been modified subsequent to its initial storage), because a duplicate of the victim data already exists in memory. The controller may then store the retrieved data into the selected cache line of the cache memory, replace the corresponding virtual memory address by the virtual memory address of the requested data, replace, as needed, the ASID in the ASID tag of the FT by an ASID associated with the request or retrieved from the TLB, and re-update the stale indicator.

Thus, in lazy flush as described herein, only one cache line is flushed at a time in response to a data request, rather than flushing the entire cache memory at once. Executing the lazy flush can save processor execution cycles and does not stall the execution unit. Furthermore, in lazy flush as described herein, a cost (e.g., processor execution cycles) to determine whether a particular cache line flush is necessary (e.g., BT lookup by the controller to see if there is a hit in BT, and determination of whether the cache line is dirty) is hidden inside the miss handling of the incoming memory requests.

Figure 3:
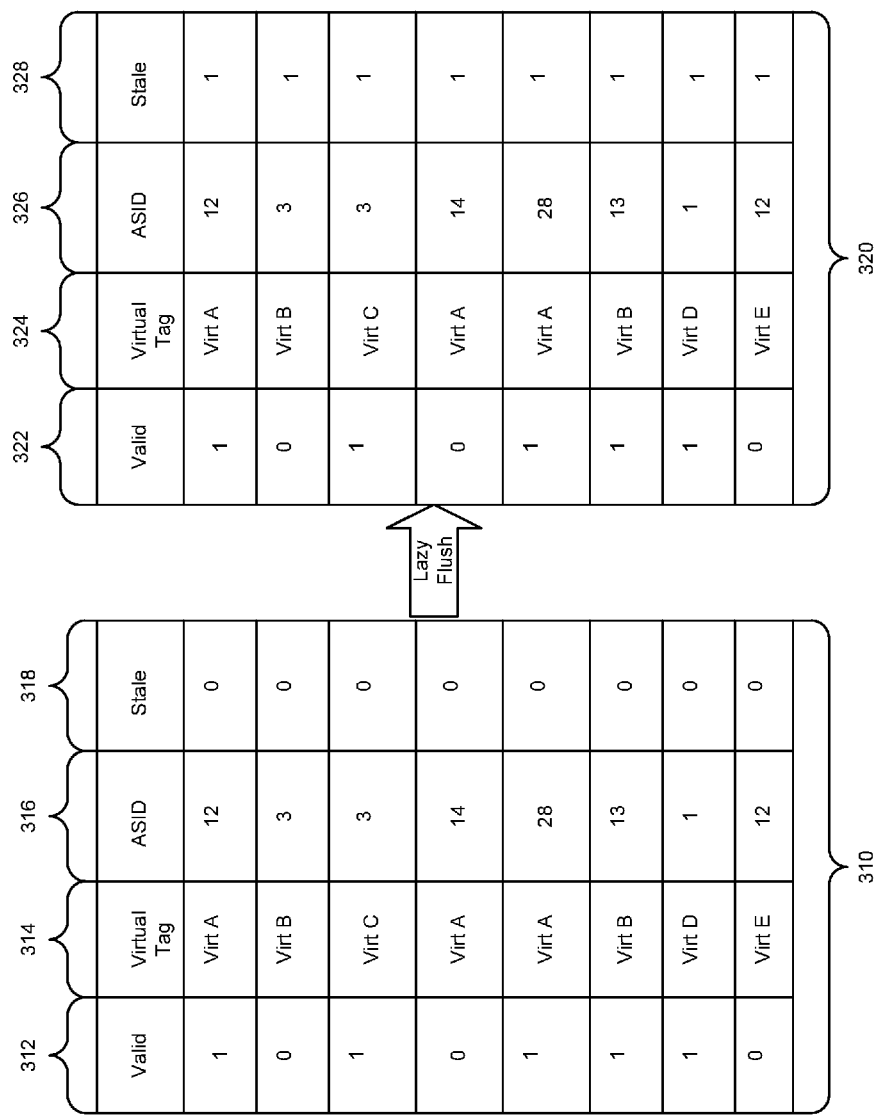
FIG. 3 is a block diagram of foreground tags of a portion of a cache memory, in accordance with an embodiment of the present invention.

Turning to FIG. 3, shown are foreground tags of a portion of a cache memory, in accordance with an embodiment of the present invention. Each horizontal line of portions 310 and 320 represents a foreground tag (FT) of a corresponding cache line. Portion 310 represents FTs prior to implementing a lazy flush configuration, and each FT of portion 310 includes a valid indicator 312, a virtual tag 314, an ASID tag 316, and a stale indicator 318 prior to updating the stale indicators.

In an implementation of the lazy flush, the stale indicator of each FT is updated. For example, table 320 shows that each of the stale indicators is updated, e.g., from a first value of 0 (shown in column 318) to a second value of 1 (shown in column 328). In the example in FIG. 3, the stale indicator is one bit. In other embodiments, the stale indicator may include multiple bits. Other parameters, e.g., valid indicators (column 312), virtual address tags (column 314), and ASID tags (column 316) shown in table 310 may maintain their values in table 320 (columns 322. 324 and 326, respectively), e.g., while the lazy flush is implemented.

Figure 4:
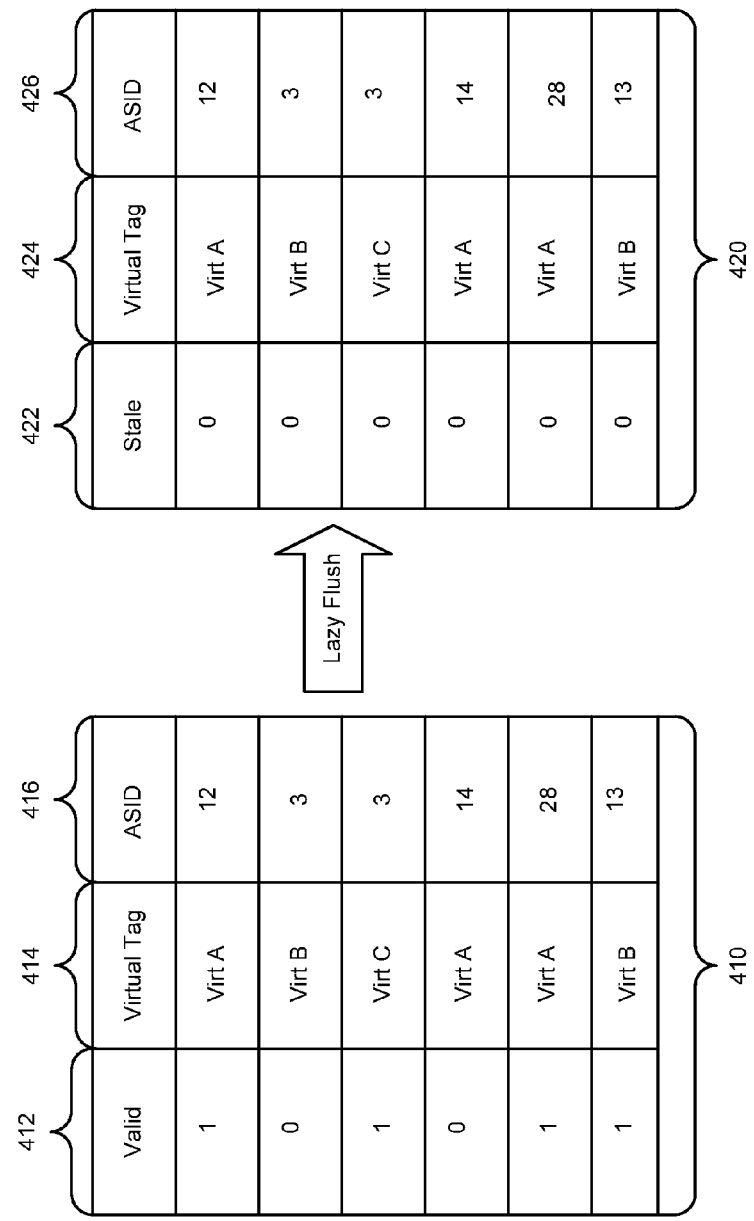
FIG. 4 is a block diagram of foreground tags of a portion of a cache memory, in accordance with another embodiment of the present invention.

Referring now to FIG. 4, shown is a portion of FTs in a cache memory, according to another embodiment of the invention. Table 410 is a representation of a portion of FTs of a cache memory, such as the cache memory 130 of FIG. 1 prior to implementation of lazy flush. Each FT stores a valid indicator (column 412), a virtual tag (column 414), and an ASID tag value (column 416). A lazy flush implementation, as shown in table 420, includes repurposement, e.g., recharacterization of the valid indicator to serve as a stale indicator. In the lazy flush embodiment of table 420, each repurposed valid indicator is updated to a value (e.g., 0, column 422). A repurposed valid indicator in column 422 may be re-updated (e.g. from 0 to 1) as the younger memory operations bring new data into the cache line (e.g., FT miss and BT miss), or the cache line gets retagged with a new ASID and a new virtual address tag (e.g., FT miss but BT hit)

Figure 5:
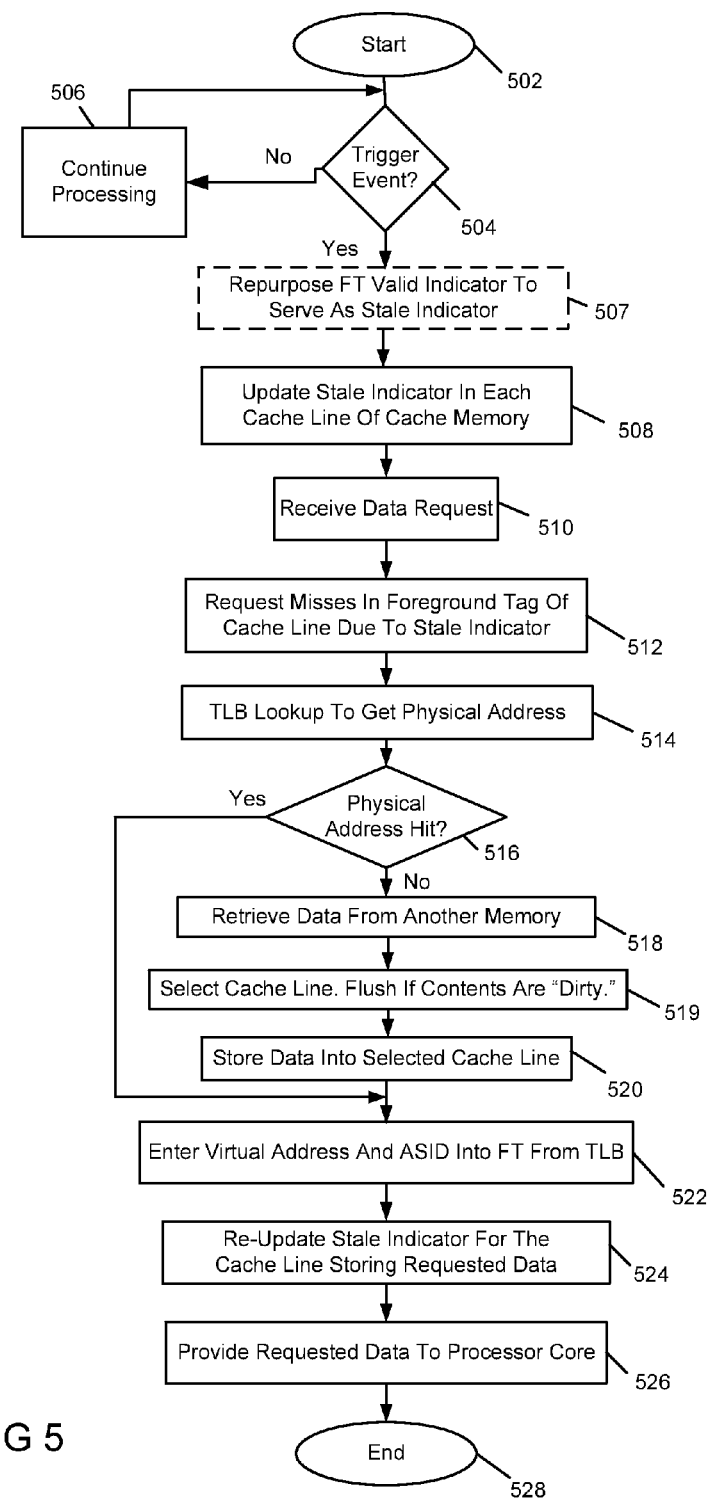
FIG. 5 is a flow diagram of a method to implement a lazy flush, according to an embodiment of the present invention.

Referring to FIG. 5, shown is a method 500 of implementing a lazy flush according to an embodiment of the invention. The method starts at block 502. Proceeding to decision diamond 504, a determination is made as to whether a trigger event has occurred, e.g., remapped TLB, lack of unused ASIDs in response to a change of context, TLB shootdown, or another trigger event. If no trigger event has occurred, moving to block 506 processing of instructions by a processor core continues. If a trigger event has occurred, optionally at block 507, FT valid indicators are repurposed to serve as stale indicators. Continuing to block 508, a stale indicator in each cache line of a cache memory is updated.

Proceeding to block 510, a request for data (the request includes a virtual memory address of the requested data) is received by the cache memory. Advancing to block 512, the data request misses when compared (e.g., by FT logic) with each of the foreground tags of the cache memory, because all stale indicators are updated. Continuing to block 514, the virtual address associated with the data request is sent to a translation lookaside buffer (TLB) to translate to a physical address of the requested data.

Moving to decision diamond 516, it is determined whether there is a physical address hit with one of the background tags (BTs) in the cache memory by comparison of the physical address received from the TLB to one or more of the BTs of the cache memory, e.g., by BT logic. If there is a physical address hit in the cache memory at decision diamond 516, the method proceeds to block 522. If there is miss in the cache memory, moving to block 518 the requested data is retrieved from another memory, e.g., system memory such as the DRAM 180 of FIG. 1. Proceeding to block 519, the cache controller selects a cache line for storage of the retrieved data, and optionally flushes the stored data in the cache line to the system memory if the stored data is dirty, e.g., the store data has been modified subsequent to its initial storage in the cache line. Continuing to block 520, the retrieved data is stored into the selected cache line.

Moving to block 522, the virtual address of the requested data and the ASID tag that are retrieved from the TLB are entered into the FT of the cache line storing the requested data. At block 524, the stale indicator is re-updated for only the cache line storing the requested data. Advancing to block 526, the requested data is provided to the processing core. The method ends at 528.

The method of FIG. 5 can be performed by hardware, software, firmware, or combinations thereof. While shown at a high level in the embodiment of FIG. 5, it is to be understood that the scope of the present invention is not so limited.

Figure 6:
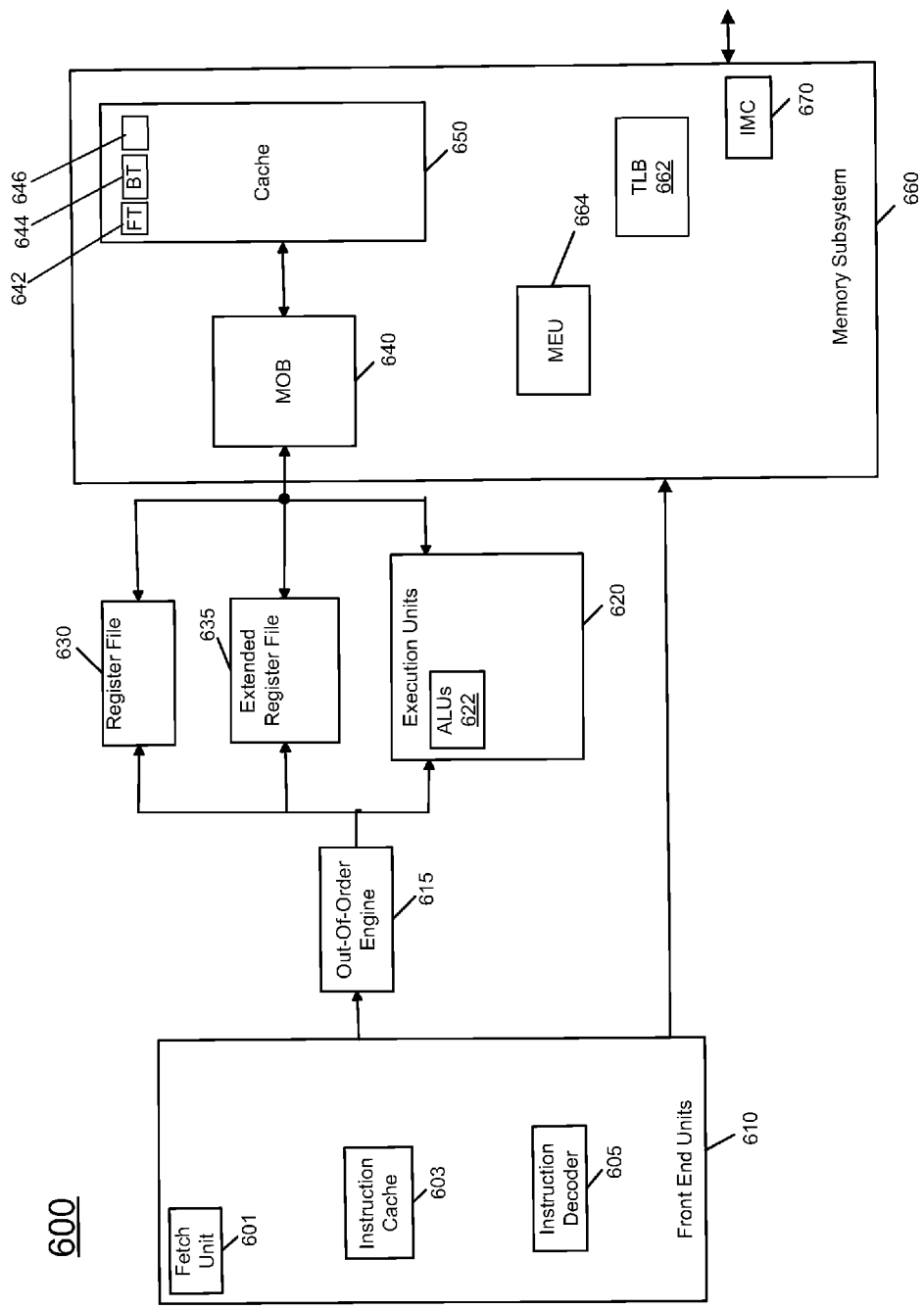
FIG. 6 is a block diagram of a processor core in accordance with an embodiment of the present invention.

Embodiments can be implemented in many different systems. For example, embodiments can be realized in a processor such as a multicore processor. Referring now to FIG. 6, shown is a block diagram of a processor core in accordance with one embodiment of the present invention. As shown in FIG. 6, core 600 may be one core of a multicore processor, and is shown as a multi-stage pipelined out-of-order processor. Processor core 600 is shown with a relatively simplified view in FIG. 6 to illustrate various features used in connection with data error correction in accordance with an embodiment of the present invention.

As shown in FIG. 6, core 600 includes front end units 610, which may be used to fetch instructions to be executed and prepare them for use later in the processor. For example, front end units 610 may include a fetch unit 601, an instruction cache 603, and an instruction decoder 605. In some implementations, front end units 610 may further include a trace cache, along with microcode storage as well as a micro-operation storage. Fetch unit 601 may fetch macro-instructions, e.g., from memory or instruction cache 603, and feed them to instruction decoder 605 to decode them into primitives, i.e., micro-operations for execution by the processor. For example, the instruction decoder 605 may decode a lazy flush instruction and may issue one or more micro-operations to perform operations associated with lazy flush.

Coupled between front end units 610 and execution units 620 is an out-of-order (OOO) engine 615 that may be used to receive the micro-instructions and prepare them for execution. More specifically OOO engine 615 may include various buffers to re-order micro-instruction flow and allocate various resources needed for execution, as well as to provide renaming of logical registers onto storage locations within various register files such as register file 630 and extended register file 635 such as by using renaming logic of the engine. Register file 630 may include separate register files for integer and floating point operations. Extended register file 635 may provide storage for vector-sized units, e.g., 256 or 512 bits per register.

Various resources may be present in execution units 620, including, for example, various integer, floating point, and single instruction multiple data (SIMD) logic units, among other specialized hardware. For example, such execution units may include one or more arithmetic logic units (ALUs) 622. Of course other execution units such as multiply-accumulate units and so forth may further be present.

Results of the execution units 620 may be provided to a retirement logic, which may be implemented within a memory subsystem 660 of the processor. Various processor structures including execution units and front end logic, for example, may be coupled to a memory subsystem 660. This memory subsystem may provide an interface between processor structures and further portions of a memory hierarchy, e.g., an on or off-chip cache and a system memory. As seen the subsystem has various components including a memory order buffer (MOB) 640. More specifically, MOB 640 may include various arrays and logic to receive information associated with instructions that are executed. This information is then examined by MOB 640 to determine whether the instructions can be validly retired and result data committed to the architectural state of the processor, or whether one or more exceptions occurred that prevent a proper retirement of the instructions. Of course, MOB 640 may handle other operations associated with retirement.

As shown in FIG. 6, MOB 640 is coupled to a cache 650 which, in one embodiment may be a low level cache (e.g., an L1 cache). The cache 650 may include a plurality of cache lines, and each cache line may include a foreground tag (FT) 642 to store a virtual memory address tag, a validity indicator, an ASID tag, and a stale indicator, as described herein. In some embodiments the validity indicator may be repurposed to serve as the stale indicator instead of having a separate stale indicator in the FT. Each cache line may also include a background tag (BT) 644 that may include a physical address tag and a validity indicator, as described herein. Each cache line may also include a data storage portion 646. Memory subsystem 660 also may include an integrated memory controller 670 to provide for communication with a system memory (not shown for ease of illustration in FIG. 6). Memory subsystem 660 may further include a memory execution unit (MEU) 675 that handles various operations to initiate memory requests and handle return of data from memory. Memory subsystem 660 may further include a translation lookaside buffer (TLB) 662 to translate virtual memory addresses to corresponding physical memory addresses. Further, while not shown understand that other structures such as buffers, schedulers and so forth may be present in the MEU 675.

From memory subsystem 660, data communication may occur with higher level caches, system memory and so forth. While shown with this high level in the embodiment of FIG. 6, understand the scope of the present invention is not limited in this regard. For example, while the implementation of FIG. 6 is with regard to an out-of-order machine such as of a so-called x86 instruction set architecture (ISA) architecture, the scope of the present invention is not limited in this regard. That is, other embodiments may be implemented in an in-order processor, a reduced instruction set computing (RISC) processor such as an ARM-based processor, or a processor of another type of ISA that can emulate instructions and operations of a different ISA via an emulation engine and associated logic circuitry.

That is, in other embodiments, a processor architecture may include emulation features such that the processor can execute instructions of a first ISA, referred to as a source ISA, where the architecture is according to a second ISA, referred to as a target ISA. In general, software, including both the OS and application programs, is compiled to the source ISA, and hardware implements the target ISA designed specifically for a given hardware implementation with special performance and/or energy efficiency features.

Figure 7:
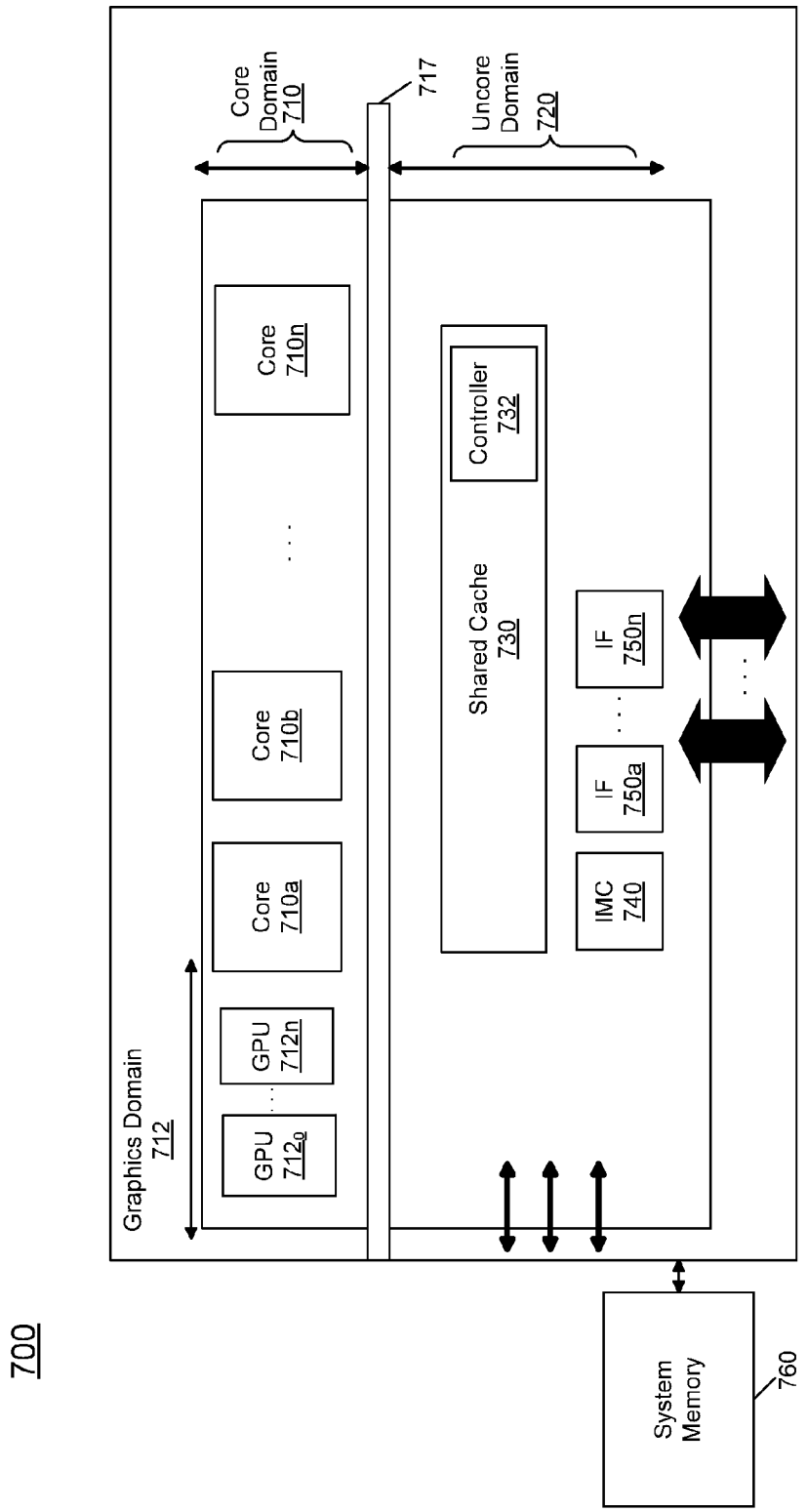
FIG. 7 is a block diagram of a processor in accordance with an embodiment of the present invention.

Referring now to FIG. 7, shown is a block diagram of a processor in accordance with an embodiment of the present invention. As shown in FIG. 7, processor 700 may be a multicore processor including a plurality of cores $710_a$-$710_n$ in a core domain 710. One or more of the cores $710_a$-$710_n$ may include a data cache in which each cache line may include a foreground tag (FT) that may include a stale indicator for use in a lazy flush as described herein. Some embodiments the FT includes a validity indicator that has been repurposed to serve as a stale indicator for use in a lazy flush as described herein. As further shown in FIG. 7, one or more graphics processing units (GPUs) $712_0$-$712_n$ may be present in a graphics domain 712. Each of these independent graphics engines also may be configured to operate at independent voltage and/or frequency or may be controlled together as a single domain. These various compute elements may be coupled via an interconnect 715 to a system agent or uncore 720 that includes various components. As seen, the uncore 720 may include a shared cache 730 which may be a last level cache. The shared cache 730 may include a plurality of entries, and each cache entry may include metadata that may include a foreground tag (FT) to store a virtual memory address tag, a validity indicator, an ASID tag, and a stale indicator to be used in a lazy flush, as described herein. In some embodiments the validity indicator may be repurposed to serve as the stale indicator instead of having a separate stale indicator in the FT. Each cache line may also include a background tag (BT) that may include a physical address tag and a validity indicator, as described herein.

With further reference to FIG. 7, processor 700 may communicate with a system memory 760, e.g., via a memory bus. In addition, by interfaces 750, connection can be made to various off-chip components such as peripheral devices, mass storage and so forth. While shown with this particular implementation in the embodiment of FIG. 7, the scope of the present invention is not limited in this regard.

Figure 8:
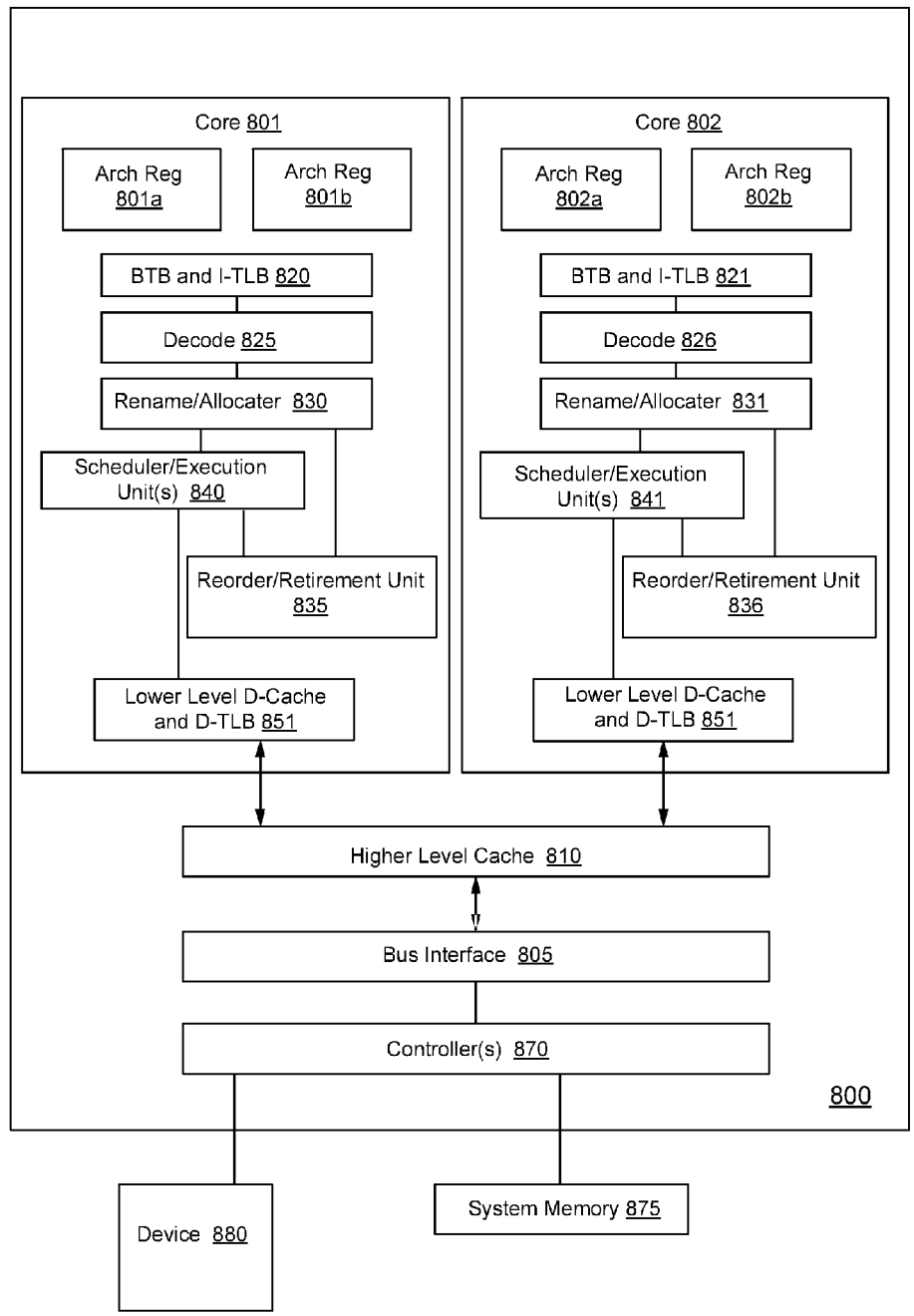
FIG. 8 is a block diagram of a processor including multiple cores, according to an embodiment of the present invention.

Referring to FIG. 8, an embodiment of a processor including multiple cores is illustrated, according to an embodiment of the present invention. Processor 800 includes any processor or processing device, such as a microprocessor, an embedded processor, a digital signal processor (DSP), a network processor, a handheld processor, an application processor, a co-processor, a system on a chip (SOC), or other device to execute code. Processor 800, in one embodiment, includes at least two cores—cores 801 and 802, which may include asymmetric cores or symmetric cores (the illustrated embodiment). However, processor 800 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 800, as illustrated in FIG. 8, includes two cores, cores 801 and 802. Here, cores 801 and 802 are considered symmetric cores, i.e., cores with the same configurations, functional units, and/or logic. In another embodiment, core 801 includes an out-of-order processor core, while core 802 includes an in-order processor core. However, cores 801 and 802 may be individually selected from any type of core, such as a native core, a software managed core, a core adapted to execute a native instruction set architecture (ISA), a core adapted to execute a translated ISA, a co-designed core, or other known core. Yet to further the discussion, the functional units illustrated in core 801 are described in further detail below, as the units in core 802 operate in a similar manner.

As depicted, core 801 includes two hardware threads 801a and 801b, which may also be referred to as hardware thread slots 801a and 801b. Therefore, software entities, such as an operating system, in one embodiment potentially view processor 800 as four separate processors, i.e., four logical processors or processing elements capable of executing four software threads concurrently. As alluded to above, a first thread is associated with architecture state registers 801a, a second thread is associated with architecture state registers

801*b*, a third thread may be associated with architecture state registers 802*a*, and a fourth thread may be associated with architecture state registers 802*b*. Here, each of the architecture state registers (801*a*, 801*b*, 802*a*, and 802*b*) may be referred to as processing elements, thread slots, or thread units, as described above. As illustrated, architecture state registers 801*a* are replicated in architecture state registers 801*b*, so individual architecture states/contexts are capable of being stored for logical processor 801*a* and logical processor 801*b*. In core 801, other smaller resources, such as instruction pointers and renaming logic in allocator and renamer block 830 may also be replicated for threads 801*a* and 801*b*. Some resources, such as re-order buffers in reorder/retirement unit 835, ILTB 820, load/store buffers, and queues may be shared through partitioning. Other resources, such as general purpose internal registers, page-table base register(s), low-level data-cache and data-TLB 815, execution unit(s) 840, and portions of out-of-order unit 835 are potentially fully shared.

Processor 800 often includes other resources, which may be fully shared, shared through partitioning, or dedicated by/to processing elements. In FIG. 8, an embodiment of a purely exemplary processor with illustrative logical units/resources of a processor is illustrated. Note that a processor may include, or omit, any of these functional units, as well as include any other known functional units, logic, or firmware not depicted. As illustrated, core 801 includes a simplified, representative out-of-order (OOO) processor core. But an in-order processor may be utilized in different embodiments. The OOO core includes a branch target buffer 820 to predict branches to be executed/taken and an instruction-translation buffer (I-TLB) 820 to store address translation entries for instructions.

Core 801 further includes decode module 825 coupled to fetch unit 820 to decode fetched elements. Fetch logic, in one embodiment, includes individual sequencers associated with thread slots 801*a*, 801*b*, respectively. Usually core 801 is associated with a first ISA, which defines/specifies instructions executable on processor 800. Often machine code instructions that are part of the first ISA include a portion of the instruction (referred to as an opcode), which references/specifies an instruction or operation to be performed. Decode logic 825 includes circuitry that recognizes these instructions from their opcodes and passes the decoded instructions on in the pipeline for processing as defined by the first ISA. For example, decoders 825, in one embodiment, include logic designed or adapted to recognize specific instructions, such as transactional instruction. As a result of the recognition by decoders 825, the architecture or core 801 takes specific, predefined actions to perform tasks associated with the appropriate instruction. It is important to note that any of the tasks, blocks, operations, and methods described herein may be performed in response to a single or multiple instructions; some of which may be new or old instructions.

In one example, allocator and renamer block 830 includes an allocator to reserve resources, such as register files to store instruction processing results. However, threads 801*a* and 801*b* are potentially capable of out-of-order execution, where allocator and renamer block 830 also reserves other resources, such as reorder buffers to track instruction results. Unit 830 may also include a register renamer to rename program/instruction reference registers to other registers internal to processor 800. Reorder/retirement unit 835 includes components, such as the reorder buffers mentioned above, load buffers, and store buffers, to support out-of-order execution and later in-order retirement of instructions executed out-of-order.

Scheduler and execution unit(s) block 840, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 851 are coupled to execution unit(s) 840, 841. The data cache is to store recently used/operated on elements, such as data operands, which are potentially held in memory coherency states. The D-TLB 851 is to store recent virtual/linear to physical address translations. As a specific example, a processor may include a page table structure to break physical memory into a plurality of virtual pages. Each data cache may store a plurality of entries and each entry may include metadata that may include a foreground tag (FT) to store a virtual memory address tag, a validity indicator, an ASID tag, and a stale indicator to be used in a lazy flush, as described herein. In some embodiments the validity indicator may be repurposed to serve as the stale indicator instead of having a separate stale indicator in the FT. Each cache line may also include a background tag (BT) that may include a physical address tag and a validity indicator, as described herein.

Here, cores 801 and 802 share access to higher-level or further-out cache 810, which is to cache recently fetched elements. Each further out cache 810 cache may store a plurality of entries and each entry may include metadata that may include a translation indicator, as described herein. Note that higher-level or further-out refers to cache levels increasing or getting further away from the execution unit(s). In one embodiment, higher-level cache 810 is a last-level data cache—last cache in the memory hierarchy on processor 800—such as a second or third level data cache. However, higher level cache 810 is not so limited, as it may be associated with or includes an instruction cache. A trace cache—a type of instruction cache—instead may be coupled after decoder 825 to store recently decoded traces.

In the depicted configuration, processor 800 also includes bus interface module 805. Historically, controller 870 has been included in a computing system external to processor 800. In this scenario, bus interface 805 is to communicate with devices external to processor 800, such as system memory 875, a chipset (often including a memory controller hub to connect to memory 875 and an I/O controller hub to connect peripheral devices), a memory controller hub, a northbridge, or other integrated circuit. And in this scenario, bus 805 may include any known interconnect, such as multi-drop bus, a point-to-point interconnect, a serial interconnect, a parallel bus, a coherent (e.g. cache coherent) bus, a layered protocol architecture, a differential bus, and a GTL bus.

Memory 875 may be dedicated to processor 800 or shared with other devices in a system. Common examples of types of memory 875 include DRAM, SRAM, non-volatile memory (NV memory), and other known storage devices. Note that device 880 may include a graphic accelerator, processor or card coupled to a memory controller hub, data storage coupled to an I/O controller hub, a wireless transceiver, a flash device, an audio controller, a network controller, or other known device.

Note however, that in the depicted embodiment, the controller 870 is illustrated as part of processor 800. Recently, as more logic and devices are being integrated on a single die, such as SOC, each of these devices may be incorporated on processor 800. For example in one embodiment, memory controller hub 870 is on the same package and/or die with processor 800. Here, a portion of the core (an on-core portion) includes one or more controller(s) 870 for interfacing with other devices such as memory 875 or a graphics device 880. The configuration including an interconnect and controllers for interfacing with such devices is often referred to as an on-core (or un-core configuration). As an example, bus interface 805 includes a ring interconnect with a memory controller for interfacing with memory 875 and a graphics controller for interfacing with graphics processor 880. Yet, in the SOC environment, even more devices, such as the network interface, co-processors, memory 875, graphics processor 880, and any other known computer devices/interface may be integrated on a single die or integrated circuit to provide small form factor with high functionality and low power consumption.

Figure 9:
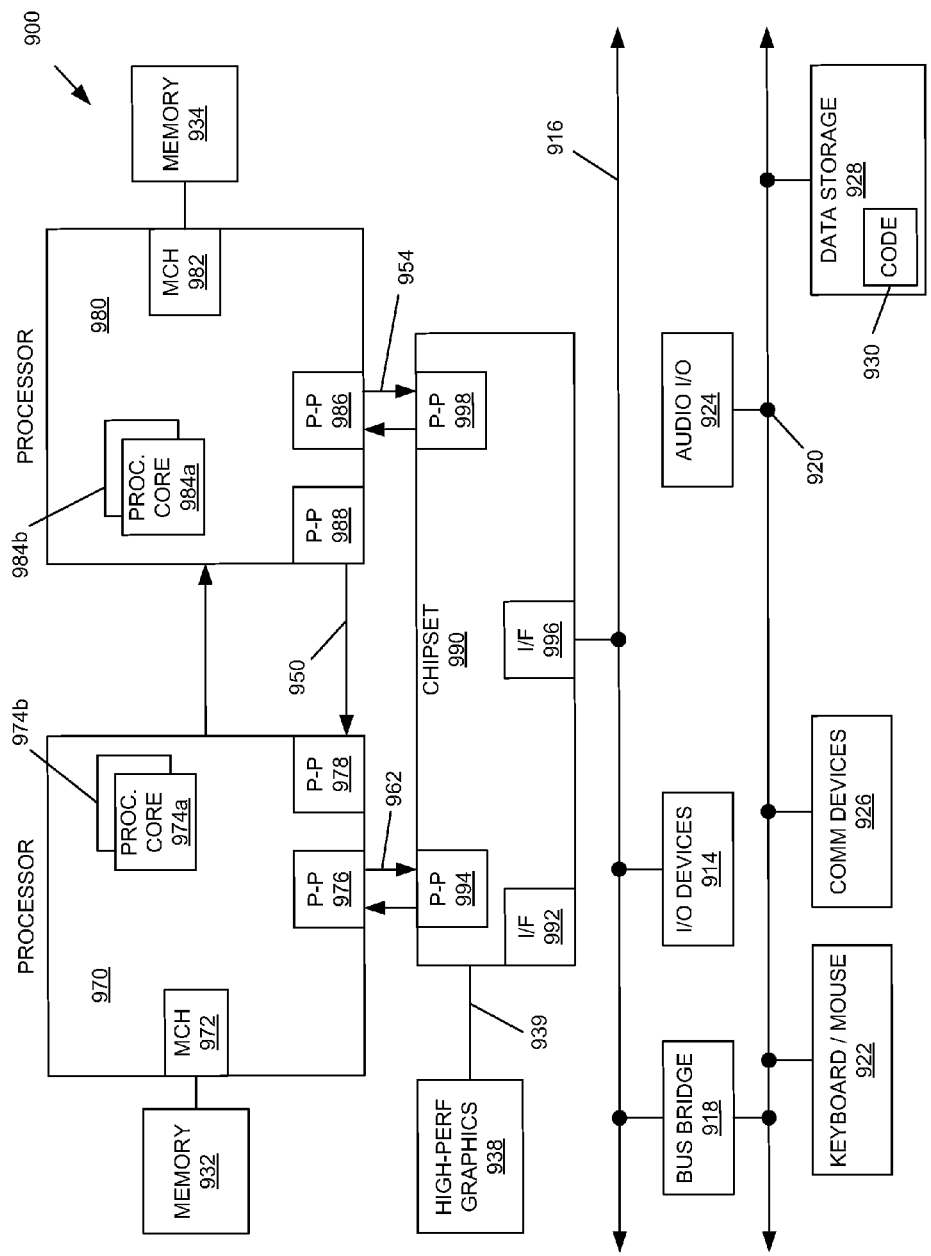
FIG. 9 is a block diagram of a system in accordance with an embodiment of the present invention.

Embodiments may be implemented in many different system types. Referring now to FIG. 9, shown is a block diagram of a system in accordance with an embodiment of the present invention. As shown in FIG. 9, multiprocessor system 900 is a point-to-point interconnect system, and includes a first processor 970 and a second processor 980 coupled via a point-to-point interconnect 950. As shown in FIG. 9, each of processors 970 and 980 may be multicore processors, including first and second processor cores (i.e., processor cores 974a and 974b and processor cores 984a and 984b), although potentially many more cores may be present in the processors. Each of the processors may include a data cache (not shown). Each data cache may store a plurality of entries and each entry may include metadata that may include a foreground tag (FT) to store a virtual memory address tag, a validity indicator, an ASID tag, and a stale indicator to be used in a lazy flush, as described herein. In some embodiments the validity indicator may be repurposed to serve as the stale indicator instead of having a separate stale indicator in the FT. Each cache line may also include a background tag (BT) that may include a physical address tag and a validity indicator, as described herein.

Still referring to FIG. 9, first processor 970 further includes a memory controller hub (MCH) 972 and point-to-point (P-P) interfaces 976 and 978. Similarly, second processor 980 includes a MCH 982 and P-P interfaces 986 and 988. As shown in FIG. 9, MCH's 972 and 982 couple the processors to respective memories, namely a memory 932 and a memory 934, which may be portions of system memory (e.g., DRAM) locally attached to the respective processors. First processor 970 and second processor 980 may be coupled to a chipset 990 via P-P interconnects 952 and 954, respectively. As shown in FIG. 9, chipset 990 includes P-P interfaces 994 and 998.

Furthermore, chipset 990 includes an interface 992 to couple chipset 990 with a high performance graphics engine 938, by a P-P interconnect 939. In turn, chipset 990 may be coupled to a first bus 916 via an interface 996. As shown in FIG. 9, various input/output (I/O) devices 914 may be coupled to first bus 916, along with a bus bridge 918 which couples first bus 916 to a second bus 920. Various devices may be coupled to second bus 920 including, for example, a keyboard/mouse 922, communication devices 926 and a data storage unit 928 such as a disk drive or other mass storage device which may include code 930, in one embodiment. Further, an audio I/O 924 may be coupled to second bus 920. Embodiments can be incorporated into other types of systems including mobile devices such as a smart cellular telephone, Ultrabook™, tablet computer, netbook, or so forth.

Embodiments may be implemented in code and may be stored on a non-transitory storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A processor comprising:
   a processor core including an execution unit to execute instructions; and
   a cache memory including:
   a controller to update each of a plurality of stale indicators in response to a lazy flush instruction, each stale indicator associated with respective data, wherein each updated stale indicator is to indicate that the respective data is stale; and
   a plurality of cache lines, each cache line to store corresponding data, and a foreground tag that includes a respective virtual address associated with the corresponding data, and that includes the associated stale indicator.

2. The processor of claim 1, further comprising a translation lookaside buffer (TLB) to provide a translation between each virtual address and a corresponding physical address of data stored in a system that includes the processor.

3. The processor of claim 2, wherein the lazy flush instruction is executed in response to detection of a trigger event that includes at least one of:
   a remap of a portion of the TLB;
   a restriction of access to a page of physical memory having a physical address stored in the TLB; and
   unavailability of an address space identifier (ASID) in response to a change of context.

4. The processor of claim 3, wherein in response to a request for first data having a first virtual address, the controller is to determine whether the first data is stored in any of the cache lines, and upon location of the first data in a first cache line, the controller is to:

re-update only the stale indicator of the first cache line to indicate that the first data stored in the first cache line is not stale; and replace the virtual address in the first cache line by the first virtual address.

5. The processor of claim 4, wherein the controller is to determine whether the first data is stored in any of the cache lines by use of the first virtual address to retrieve a first physical address from the TLB and comparison of the first physical address to a corresponding physical address of the data stored in at least one of the cache lines.

6. The processor of claim 5, wherein in response to a determination that the data stored in the cache lines does not correspond to the first virtual address, the controller is to:
retrieve the first data from another memory using the first physical address; and
store the retrieved first data in a second cache line; and
after the retrieved first data is stored in the second cache line, re-update the stale indicator in the second cache line to indicate that the stored data is not stale.

7. The processor of claim 6, wherein the controller is to select the second cache line to store the retrieved data based at least in part on corresponding metadata included in each of one or more of the cache lines.

8. The processor of claim 7, wherein prior to storage of the retrieved data in the second cache line, the controller is to flush second data stored in the second cache line to a main memory in response to an indication that the second data has been modified subsequent to storage of the second data in the cache.

9. The processor of claim 7, where the controller is to overwrite second data stored in the second cache line with the requested data in response to an indication that the second data has not been modified subsequent to storage of the second data in the cache.

10. The processor of claim 1, wherein at least one of the stale indicators is repurposed from a corresponding validity indicator in the foreground tag.

11. The processor of claim 1, wherein the cache memory further comprises, for each cache line, a corresponding background tag to store a corresponding physical address associated with the corresponding data stored in the cache line.

12. The processor of claim 1, wherein the foreground tag further includes a validity indicator to indicate whether data corresponding to the virtual address is valid.

13. A system comprising:
a processor that includes:
an execution unit to execute one or more instructions; and
a cache memory comprising:
a plurality of cache lines to store data, wherein each cache line includes a corresponding stale indicator to indicate whether corresponding data stored in the cache line is stale, and also includes a corresponding virtual address; and
a controller to update the stale indicator in each of the plurality of cache lines in response to execution of a lazy flush instruction, wherein the lazy flush instruction specifies that upon a data request, at most one cache line is to be flushed and replacement data is to be stored in the one cache line; and
a dynamic random access memory (DRAM) coupled to the processor to store data that is accessible to the execution unit.

14. The system of claim 13, further comprising a translation lookaside buffer (TLB) to provide a correspondence between a virtual address associated with stored data and a corresponding physical address in the DRAM that stores the stored data.

15. The system of claim 14, wherein the stale indicator of each line of the cache memory is to be updated to indicate that the corresponding stored data is stale in response to detection of a condition that includes at least one of:
a first virtual address in the TLB is remapped from a first physical address to a second physical address;
access to a page of the DRAM whose physical address is in the TLB is restricted; and
unavailability of a previously unassigned address space identifier (ASID) in response to a context change.

16. The system of claim 14, wherein in response to a request for first data having a first virtual address, the controller is to determine whether the first data is stored in any of the cache lines and if so, the controller is to:
re-update only the corresponding stale indicator in a first cache line that stores the first data to indicate that the first data is not stale; and
replace the virtual address in the first cache line with the first virtual address.

17. The system of claim 16, wherein in response to a determination that the first data is not stored in the cache memory, the controller is to:
locate and retrieve the first data from another memory;
store the first data in a second cache line;
re-update the corresponding stale indicator of the second cache line to indicate that the retrieved data is not stale; and
replace the virtual address in the second cache line with the first virtual address.

18. The system of claim 14, further comprising background tag logic to determine, based on corresponding physical address information stored within a corresponding background tag of each cache line, whether requested data is valid and is in the cache memory.

19. A method comprising:
in response to a trigger condition, executing a lazy flush instruction to update a plurality of stale indicators to indicate that data stored in a corresponding plurality of cache lines of a cache memory is stale;
after executing the lazy flush instruction, searching the cache memory to locate first data in response to a data request that includes a first virtual address; and
if the first data is located in the cache memory:
replacing a virtual address in a foreground tag of a first cache line with the first virtual address;
updating a first stale indicator associated with the first cache line storing the first data to indicate that the first data is not stale; and
providing the first data in response to the request.

20. The method of claim 19, further comprising if the first data is not located in the cache memory:
retrieving the first data from another memory;
storing the first data in a selected cache line of the cache memory;
replacing a virtual address stored in the selected cache line with the first virtual address; and
updating the first stale indicator associated with the selected cache line.

21. The method of claim 19, wherein the trigger condition is one of:
a remap of a translation lookaside buffer (TLB) in a system that includes a cache memory;

unavailability of an unassigned address space identifier (ASID) in response to a context change in a processor that accesses the cache memory; and an access restriction to an address in the TLB.

22. The method of claim 19, further comprising prior to updating the plurality of stale indicators, reassigning a plurality of valid indicators to be the plurality of stale indicators, wherein each of the plurality of valid indicators is located in a corresponding cache line.

* * * * *